United States Patent
Xiao et al.

(10) Patent No.: US 12,171,057 B2
(45) Date of Patent: Dec. 17, 2024

(54) MANUFACTURING METHOD FOR PCB WITH THERMAL CONDUCTOR EMBEDDED THEREIN, AND PCB

(71) Applicant: SHENGYI ELECTRONICS CO., LTD., Guangdong (CN)

(72) Inventors: Lu Xiao, Guangdong (CN); Hongyu Wu, Guangdong (CN); Chengguang Ji, Guangdong (CN); Mengru Liu, Guangdong (CN); Zhengqing Chen, Guangdong (CN); Hongbing Du, Guangdong (CN); Haibo Tang, Guangdong (CN)

(73) Assignee: SHENGYI ELECTRONICS CO., LTD., Guangdong (CN)

( * ) Notice: Subject to any disclaimer, the term of this patent is extended or adjusted under 35 U.S.C. 154(b) by 493 days.

(21) Appl. No.: 17/635,386

(22) PCT Filed: Aug. 11, 2020

(86) PCT No.: PCT/CN2020/108352
§ 371 (c)(1),
(2) Date: Feb. 15, 2022

(87) PCT Pub. No.: WO2021/052060
PCT Pub. Date: Mar. 25, 2021

(65) Prior Publication Data
US 2022/0346217 A1  Oct. 27, 2022

(30) Foreign Application Priority Data
Sep. 19, 2019  (CN) .................. 201910889232.X (51) Int. Cl.
*H05K 1/02* (2006.01)
*H05K 3/00* (2006.01)
(Continued)

(52) U.S. Cl.
CPC .......... *H05K 1/021* (2013.01); *H05K 3/0047* (2013.01); *H05K 3/4611* (2013.01); *H05K 3/06* (2013.01); *Y10T 29/49158* (2015.01)

(58) Field of Classification Search
CPC .... H05K 1/0204; H05K 1/021; H05K 3/0047; H05K 3/0061; H05K 3/06; H05K 3/4602;
(Continued)

(56) References Cited

U.S. PATENT DOCUMENTS 5,285,352 A * 2/1994 Pastore ............... H01L 23/3677
257/E23.101
11,160,160 B1 * 10/2021 Berkel .................... H01L 23/13
(Continued)

FOREIGN PATENT DOCUMENTS

| CN | 102629560 A | 8/2012 |
| CN | 107222983 A | 9/2017 |

(Continued)

OTHER PUBLICATIONS

CN 107222983 translation from FIT database (Year: 2024).*
CN110139466 translation from FIT database (Year: 2024).*
CN 111901987 translation from FIT database (Year: 2024).*
(Continued)

*Primary Examiner* — Aneeta Yodichkas
*Assistant Examiner* — Joshua D Anderson
(74) *Attorney, Agent, or Firm* — Yu (Robert) Xu; Apex Attorneys at Law, LLP (57) ABSTRACT

A method for manufacturing a PCB with an embedded thermal conductor and a PCB are provided. A sheet of copper-clad ceramic serves as a thermal conductor. A sheet of copper foil having no opening serves as an outer layer of a laminate. A part of the sheet of copper foil covering the thermal conductor is removed after a lamination process, to expose a conductive layer as the outer layer of the thermal
(Continued)

conductor. Finally, the outer layer pattern is formed. The sheet of copper foil has no opening before the lamination process, so that the sheet of copper foil has good flatness during the lamination process, thereby avoiding wrinkles. Moreover, the sheet of copper-clad ceramic serves as the thermal conductor, so that a pattern is manufactured on the outer layer of the thermal conductor based on the exposed conductive layer.

8 Claims, 4 Drawing Sheets

(51) Int. Cl.
*H05K 3/06* (2006.01)
*H05K 3/46* (2006.01)

(58) Field of Classification Search
CPC .............. H05K 3/4611; H05K 3/4629; H05K 3/4632; H05K 3/4694; H05K 2201/10416; H05K 2203/061; H05K 2203/063; H05K 2203/065; H05K 2203/066; H05K 2203/068; Y10T 29/49126; Y10T 29/49155; Y10T 29/49158; Y10T 29/4916
See application file for complete search history.

(56) References Cited

U.S. PATENT DOCUMENTS

| | | | |
|---|---|---|---|
| 2012/0199955 A1 | 8/2012 | Sun | |
| 2013/0100197 A1* | 4/2013 | Donahue | B41J 2/16517 347/17 |
| 2016/0192473 A1* | 6/2016 | Kasashima | H05K 1/0204 174/251 |
| 2016/0366757 A1* | 12/2016 | Kobayashi | H05K 1/0204 |
| 2016/0374189 A1* | 12/2016 | Lee | H05K 3/4697 |
| 2018/0025956 A1* | 1/2018 | Cheng | H01L 23/13 29/832 |
| 2018/0114739 A1* | 4/2018 | Wang | H01L 21/486 |

FOREIGN PATENT DOCUMENTS

| | | | | |
|---|---|---|---|---|
| CN | 107708315 A | | 2/2018 | |
| CN | 110139466 A | | 8/2019 | |
| CN | 110519912 A | | 11/2019 | |
| CN | 111901987 A | * | 11/2020 | ........... H05K 1/0204 |
| JP | 108172264 A | | 7/1996 | |

OTHER PUBLICATIONS

International Search Report for PCT/CN2020/108352 mailed Oct. 29, 2020, ISA/CN.

Discussion on the improvement method of wrinkling process of PCB laminated copper foil, www.china-nengyuan.com, Mar. 5, 2019.

* cited by examiner

MANUFACTURING METHOD FOR PCB WITH THERMAL CONDUCTOR EMBEDDED THEREIN, AND PCB

The present application is the national phase of International Patent Application No. PCT/CN2020/108352, titled "MANUFACTURING METHOD FOR PCB WITH THERMAL CONDUCTOR EMBEDDED THEREIN, AND PCB", filed on Aug. 11, 2020, which claims priority to Chinese Patent Application No. 201910889232.X, titled "MANUFACTURING METHOD FOR PCB WITH THERMAL CONDUCTOR EMBEDDED THEREIN, AND PCB", filed on Sep. 19, 2019 with the China National Intellectual Property Administration, both of which are incorporated herein by reference in their entireties.

FIELD

The present disclosure relates to the technical field of PCB (printed circuit board), and in particular to a method for manufacturing a PCB with an embedded thermal conductor and a PCB.

BACKGROUND

At present, heat generated locally on a PCB is dissipated with the embedded metal block technology, in which heat generated by high-power devices on a surface of the PCB is dissipated in time due to high thermal conductivity of metals such as copper and aluminum, so as to cool down the devices and the apparatus and improve their service life and electrical performance.

Figure 1:
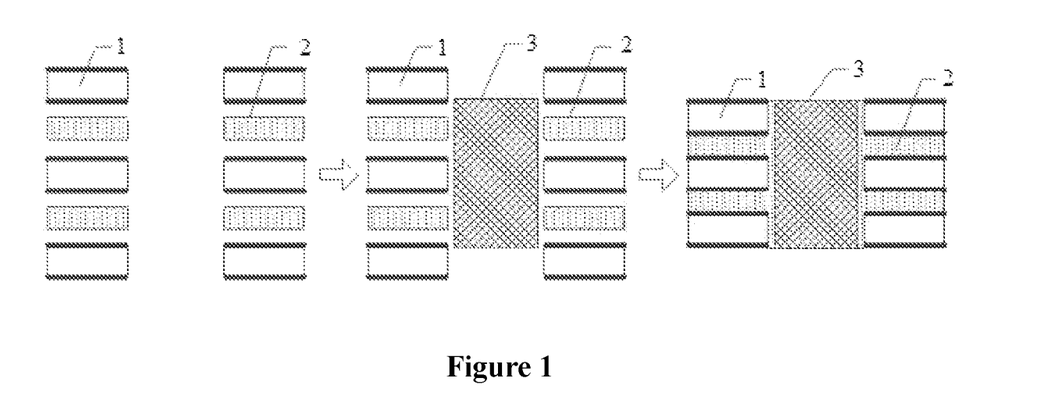
FIG. 1 is a schematic diagram showing a first method for manufacturing a PCB with an embedded thermal conductor according to the conventional technology.

The embedded metal block technology is usually applied to a board of laminated cores. Referring to FIG. 1, the board is formed as follows. First, multiple cores 1 and multiple bonding sheets 2 each are provided with an opening passing through the same at the same positions. Then, the multiple cores 1 and the multiple bonding sheets 2 are stacked in a certain sequence, so that a through hole is formed by these openings. A metal block 3 is arranged in the through hole. Finally, a lamination process is performed on the stacked structure at a high temperature.

Figure 2:
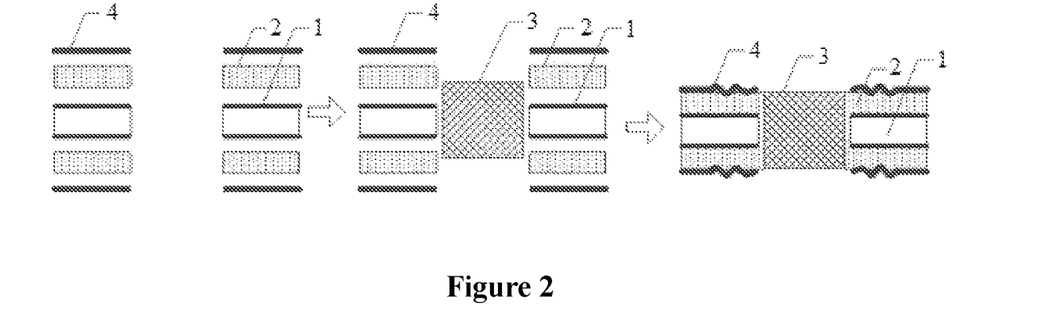
FIG. 2 is a schematic diagram showing a second method for manufacturing a PCB with an embedded thermal conductor according to the conventional technology.

However, embedding a metal block in a high density interconnector board (HDI board) may result in some problems. Reference is made FIG. 2. First, sheets of copper foil 4, a core 1 and bonding sheets 2 each are provided with an opening through the same at the same positions. Then, the sheets of copper foil 4, the core 1 and the bonding sheets 2 are stacked in a certain sequence, so that a through hole is formed by these openings. A metal block 3 is arranged in the through hole. Finally, a lamination process is performed on the stacked structure at a high temperature. In this process, since a sheet of copper foil 4 on an outer layer is provided with an opening before the lamination process, the sheet of copper foil 4 is prone to wrinkles around the opening after the lamination process is performed at a high temperature. Further, conventional buffer materials (such as a sheet of aluminum and a release film, etc.) used in the lamination process may aggravate the wrinkles. In addition, no circuit trace is formed on the outer surface of the metal block 3, limiting overall density of circuit traces.

SUMMARY

A method for manufacturing a PCB with an embedded thermal conductor and a PCB are provided according to the present disclosure, to overcome the problems that the sheet of copper foil is prone to wrinkles and that the overall density of circuit traces is limited in the conventional technology.

In order to solve the above problems, the following technical solutions are provided according to the present disclosure.

A method for manufacturing a PCB with an embedded thermal conductor includes:
stacking a first sheet of copper foil, cores each with an opening or a specified daughter board with an opening, a bonding sheet with an opening, and a second sheet of copper foil in a predetermined sequence, and arranging a thermal conductor in a thermal conductor accommodating hole formed by the openings, to form a stacked structure, where the thermal conductor is flush with the stacked structure, and each of the first sheet of copper foil and the second sheet of copper foil has no opening;
performing a lamination process at a high temperature, to form a laminate, where a part of a surface of the laminate covering the thermal conductor protrudes from other part of the surface of the laminate not covering the thermal conductor;
removing a part of the first sheet of copper foil covering the thermal conductor and a part of the second sheet of copper foil covering the thermal conductor, to expose a conductive layer of the thermal conductor; and
manufacturing an outer layer pattern on an outer layer of the thermal conductor and/or an outer layer of the laminate not covering the thermal conductor.

In an embodiment, the method for manufacturing a PCB with an embedded thermal conductor further includes: manufacturing the thermal conductor. The manufacturing the thermal conductor includes:
plating copper on the seed layer arranged on each of an upper outer surface and a lower outer surface of a large sheet of ceramic having a specified thickness, to form a large sheet of copper-clad ceramic, and
dividing the large sheet of copper-clad ceramic into a plurality of small sheets of copper-clad ceramic each having a specified size, to obtain the thermal conductor.

In an embodiment, the manufacturing the thermal conductor further includes: roughening a surface and/or a side face of each of the small sheets of copper-clad ceramic.

In an embodiment, the performing a lamination process at a high temperature includes:
forming a layer of flowable material or softenable material on a pressing surface of a pressing plate; and
arranging the stacked structure between two pressing plates to perform the lamination process at a high temperature, where the flowable material or softenable material flows from a first region of the stacked structure to a second region of the stacked structure, and a thickness of the first region is greater than a thickness of the second region.

In an embodiment, the manufacturing an outer layer pattern includes: manufacturing, by pattern transfer, the outer layer pattern simultaneously on the outer layer of the thermal conductor and the outer layer of the laminate not covering the thermal conductor.

In an embodiment, the manufacturing an outer layer pattern includes: manufacturing the outer layer pattern on one of the outer layer of the thermal conductor and the outer layer of the laminate not covering the thermal conductor, where the other of the outer layer of the thermal conductor and the outer layer of the laminate not covering the thermal conductor is protected.

In an embodiment, the part of the sheet of copper foil is removed by processes of dry film, exposure, developing and etching.

In an embodiment, the thermal conductor accommodating hole is greater than the thermal conductor in cross section. The method for manufacturing a PCB further includes: drilling at four corners of the thermal conductor accommodating hole to form an arc at each of the four corners, where the arc is tangent to a right angle of the thermal conductor.

In an embodiment, an isolation layer is formed on the layer of flowable material or softenable material.

A PCB is provided. The PCB is manufactured by performing the method according to any one of the above embodiments.

Compared with the conventional technology, the present disclosure has the following beneficial effects.

In the embodiments of the present disclosure, the sheet of copper-clad ceramic serves as the thermal conductor. The sheet of copper foil having no opening serves as the outer layer. The part of the sheet of copper foil covering the thermal conductor is removed after the lamination process, to expose the conductive layer as the outer layer of the thermal conductor. Finally, the outer layer pattern is formed. The sheet of copper foil has no opening before the lamination process, so that the sheet of copper foil has good flatness during the lamination process, thereby avoiding wrinkles. Moreover, the sheet of copper-clad ceramic serves as the thermal conductor, so that a pattern is manufactured on the outer layer of the thermal conductor based on the exposed conductive layer, improving the overall density of circuit traces of the PCB.

BRIEF DESCRIPTION OF THE DRAWINGS

In order to more clearly describe the technical solutions in the embodiments of the present disclosure or the technical solutions in the conventional technology, drawings to be used in the description of the embodiments or the conventional technology are briefly described hereinafter. It is apparent that the drawings described below show merely some embodiments of the present disclosure, and those skilled in the art may obtain other drawings according to the provided drawings without any creative effort.

DETAILED DESCRIPTION OF THE EMBODIMENTS

In order to make the objects, features and advantages of the present disclosure clear and understandable, technical solutions of embodiments of the present disclosure are clearly and completely described below in conjunction with the drawings in the embodiments of the present disclosure. Apparently, the embodiments described in the following are only some rather than all embodiments of the present disclosure. All other embodiments obtained by those skilled in the art based on the embodiments in the present disclosure without any creative effort fall within the protection scope of the present disclosure.

First Embodiment

Figure 3:
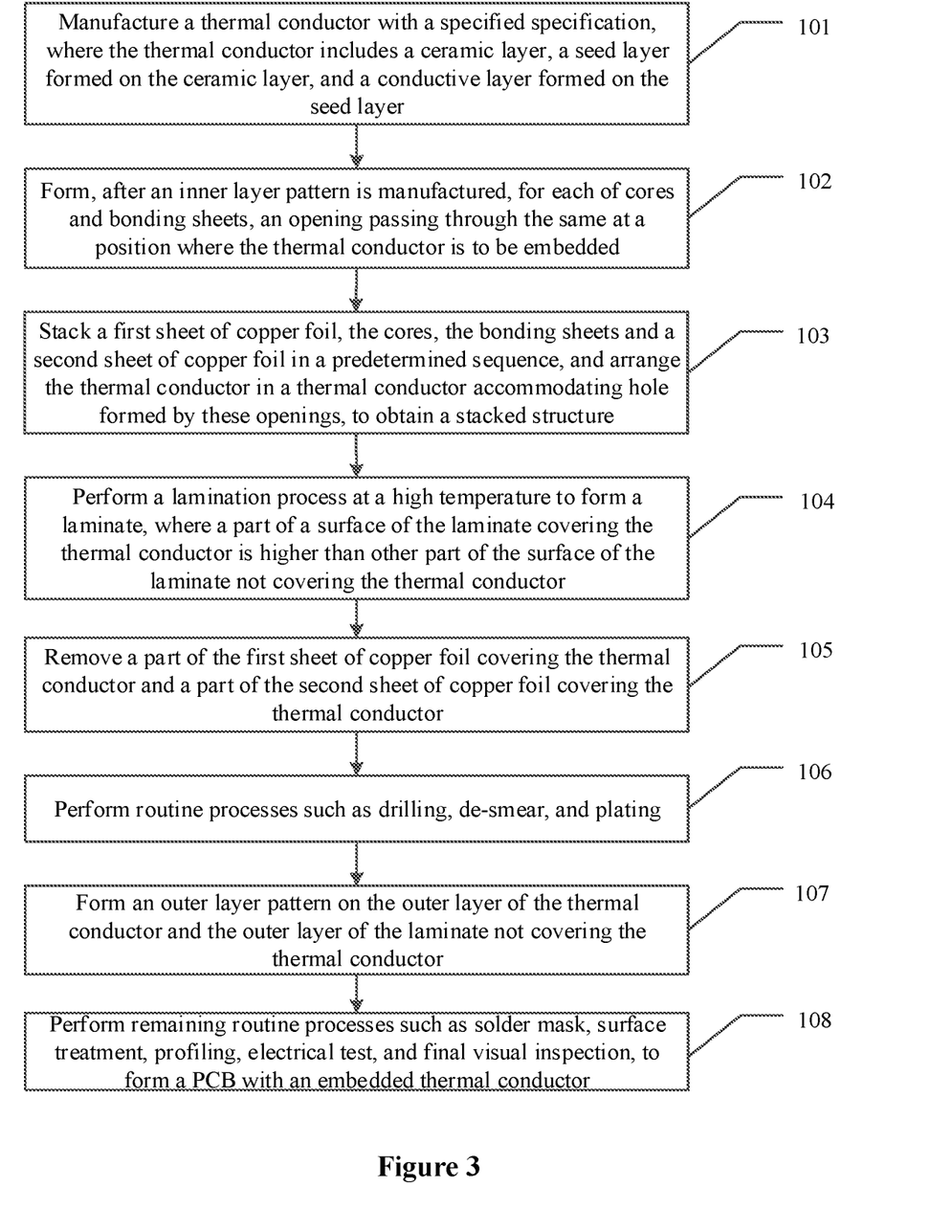
FIG. 3 is a flowchart of a method for manufacturing a PCB (without a daughter board) with an embedded thermal conductor according to an embodiment of the present disclosure.
Figure 4:
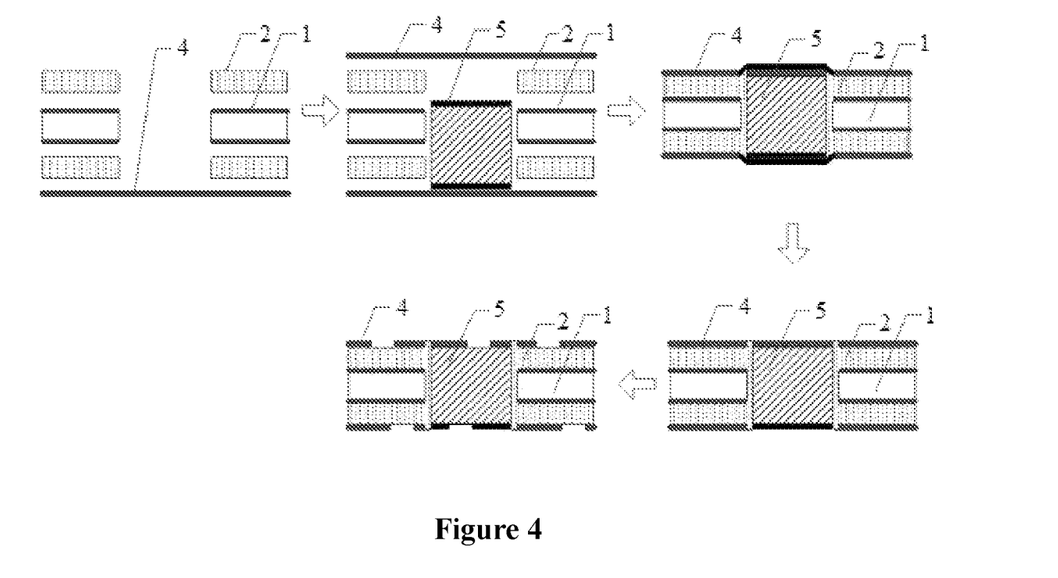
FIG. 4 is a schematic diagram showing a method for manufacturing a PCB with an embedded thermal conductor according to an embodiment of the present disclosure.

Reference is made to FIGS. 3 and 4. FIG. 3 is a flowchart of a method for manufacturing a PCB, and FIG. 4 is a schematic diagram showing the method for manufacturing a PCB. The method for manufacturing a PCB with an embedded thermal conductor according to the embodiment of the present disclosure includes the following steps 101 to 108.

In step 101, a thermal conductor 5 with a specified size is manufactured. The thermal conductor 5 includes a ceramic layer, a seed layer formed on the ceramic layer, and a conductive layer formed on the seed layer.

The thermal conductor 5 is used for heat dissipation and is manufactured as follows. The seed layer is formed on each of an upper surface and a lower surface of a large sheet of ceramic with a certain thickness. Then, the conductive layer such as a copper layer is formed on the seed layer to form a large sheet of copper-clad ceramic. The large sheet of copper-clad ceramic is divided into multiple small sheets of copper-clad ceramic of a specified size. Finally, a surface and/or a side face of the small sheet of copper-clad ceramic are roughened to obtain the thermal conductor 5 with the specified specification as required. The thermal conductor 5 may have a metal structure, such as copper and aluminum.

A thermal conductor accommodating hole is a through hole, for accommodating the thermal conductor 5. The thermal conductor 5 is flush with a part of the laminate other than a part where the thermal conductor is embedded. In addition, due to the influence of processing accuracy, an actual size of the thermal conductor 5 and an actual size of the thermal conductor accommodating hole may differ from their respective specified sizes. Therefore, in order to arrange the thermal conductor 5 into the thermal conductor accommodating hole, the thermal conductor accommodating hole may be slightly greater than the thermal conductor 5 in cross section.

In step 102, after an inner layer pattern is manufactured, for each of cores 1 and bonding sheets 2, an opening passing through the same is formed at a position where the thermal conductor 5 is to be embedded. In the subsequent lamination process, these openings of the cores 1 and the bonding sheets 2 form the thermal conductor accommodating hole.

In step 103, a first sheet of copper foil 4 for an outer layer, the cores 1, the bonding sheets 2 and a second sheet of copper foil 4 for an outer layer are stacked in a predetermined sequence, and the thermal conductor 5 is arranged in the thermal conductor accommodating hole formed by these openings, to obtain a stacked structure.

No opening passes through each of the first sheet of copper foil 4 and the second sheet of copper foil 4. The first sheet of copper foil 4 and the second sheet of copper foil 4 are respectively arranged on a lower outer layer and an upper outer layer of the stacked structure.

In order to obtain the stacked structure, the first sheet of copper foil 4, the cores 1 and the bonding sheets 2 are stacked in a predetermined sequence. The first sheet of copper foil 4 is arranged at the bottom. That is, the first sheet of copper foil 4, a bonding sheet 2, a core 1, ..., a bonding sheet 2, a core 1, and a bonding sheet 2 are sequentially arranged from bottom to top. Then the thermal conductor 5 is arranged in the thermal conductor accommodating hole. Next, the second sheet of copper foil 4 is arranged at the top.

The thermal conductor accommodating hole is generally manufactured by mechanical milling, and thus hardly has a right angle in cross section due to limitation of a diameter of a milling cutter. The thermal conductor accommodating hole is drilled at four corners to form an arc at each of the four corners. The arc is tangent to a right angle of the thermal conductor 5, so that the thermal conductor 5 with four corners at right angles is arranged in the thermal conductor accommodating hole completely.

In step 104, a lamination process is performed on the stacked structure at a high temperature to form a laminate. A part of a surface of the laminate covering the thermal conductor higher than other surface of the laminate not covering the thermal conductor.

The thermal conductor 5 manufactured in step 101 is flush with the part of the laminate other than the part where the thermal conductor is embedded, and each of the first sheet of copper foil 4 and the second sheet of copper foil 4 on the outer layers of the laminate has no opening at the position where the thermal conductor is embedded. Therefore, after the laminate is formed, the part of the laminate where the thermal conductor is embedded protrudes, so that the surface of the laminate is not flat.

In order to level the surface of the laminate, a flowable material or softenable material (for example, a TPX film (poly 4-methyl-1-pentene) with certain fluidity at a high temperature) is added on a pressing surface of each of two pressing plates (for example, aluminum plates), where the two pressing plates are used for pressing the stacked structure on the upper and lower surfaces of the stacked structure, respectively. In this way, a layer of the flowable material or softenable material is formed between the laminate and the pressing surface of each of the two pressing plates at a high temperature. When pressing the stacked structure, the flowable material or softenable material softens and flows slowly from a high region to a low region, so as to level the surface of the laminate.

In order to prevent the flowable material/softenable material from adhering to the surface of the laminate or flowing into a registration hole when pressing the stacked structure, a flowable material/softenable material with isolation property is selected. Alternatively, an isolation layer is formed on the layer of flowable material/softenable material, to achieve isolation.

In step S105, a part of the first sheet of copper foil 4 covering the thermal conductor and a part of the second sheet of copper foil 4 covering the thermal conductor are removed.

The part of the sheet of copper foil covering the thermal conductor is removed by processes of dry film, exposure, developing and etching.

After the part of the sheet of copper foil is removed, the region of the laminate where the thermal conductor is embedded is substantially flush with other regions, so that the surface of the laminate is flat. Further, the conductive layer as the outer layer of the thermal conductor 5 is exposed.

After the part of copper foil 4 is removed, the dry film is required to be stripped off. If there are adhesive residues on the surface of the thermal conductor 5 or the surface of the laminate, the de-smear processing is required.

In step 106, general processes such as drilling, de-smear, and copper plating are performed.

This step is performed based on general processes, which are the same as the conventional technology, and are not described in detail herein.

In step S107, an outer layer pattern is manufactured on the outer layer of the thermal conductor 5 and the outer layer of the laminate.

Generally, a conductive layer is hardly formed on a surface of a sheet of ceramic by copper plating. In order to obtain a sheet of copper-clad ceramic, a seed layer (such as a titanium layer and a nickel layer) is formed on the surface of the sheet of ceramic first, and then the conductive layer is formed on the seed layer by copper plating.

In order to form an outer layer pattern on the outer layer of the thermal conductor 5, an unwanted part of the conductive layer where on pattern is to be formed is removed and a part of the seed layer under the part of the conductive layer is removed. The seed layer is removed with a method depending on a material of the seed layer, otherwise the seed layer cannot be effectively removed. The outer layer pattern on the outer layer of the laminate other than the thermal conductor 5 is formed by etching to remove unwanted copper. The etching solution herein cannot remove some seed layers. Therefore, in this step, if the seed layer can be removed by conventional etching, the outer layer pattern is formed simultaneously on the outer layer of the thermal conductor 5 and on the outer layer of the laminate, so as to improve the manufacturing efficiency. If the seed layer cannot be removed by conventional etching, the outer layer pattern is formed separately on the outer layer of the thermal conductor 5 and the outer layer of the laminate, so as to avoid mutual influence.

In step 108, remaining general processes such as solder mask, surface finish, profiling, electrical test, and final quality check are performed, so that a PCB with an embedded thermal conductor is finished.

The method for manufacturing a PCB without a daughter board is provided according to this embodiment. In the method, the sheet of copper-clad ceramic serves as the thermal conductor 5. The sheet of copper foil 4 without an opening is arranged on the outer layer, and the part of the sheet of copper foil 4 covering the thermal conductor 5 is removed after the lamination process, to expose the conductive layer as the outer layer of the thermal conductor 5. Finally, the outer layer pattern is formed. The sheet of copper foil 4 has no opening before the lamination process, so that the sheet of copper foil 4 has good flatness during the lamination process, thereby avoiding wrinkles. Moreover, the sheet of copper-clad ceramic serves as the thermal conductor 5, so that a pattern is manufactured on the outer layer of the thermal conductor 5 based on the exposed conductive layer, improving the overall density of circuit traces of the PCB.

Second Embodiment

Figure 5:
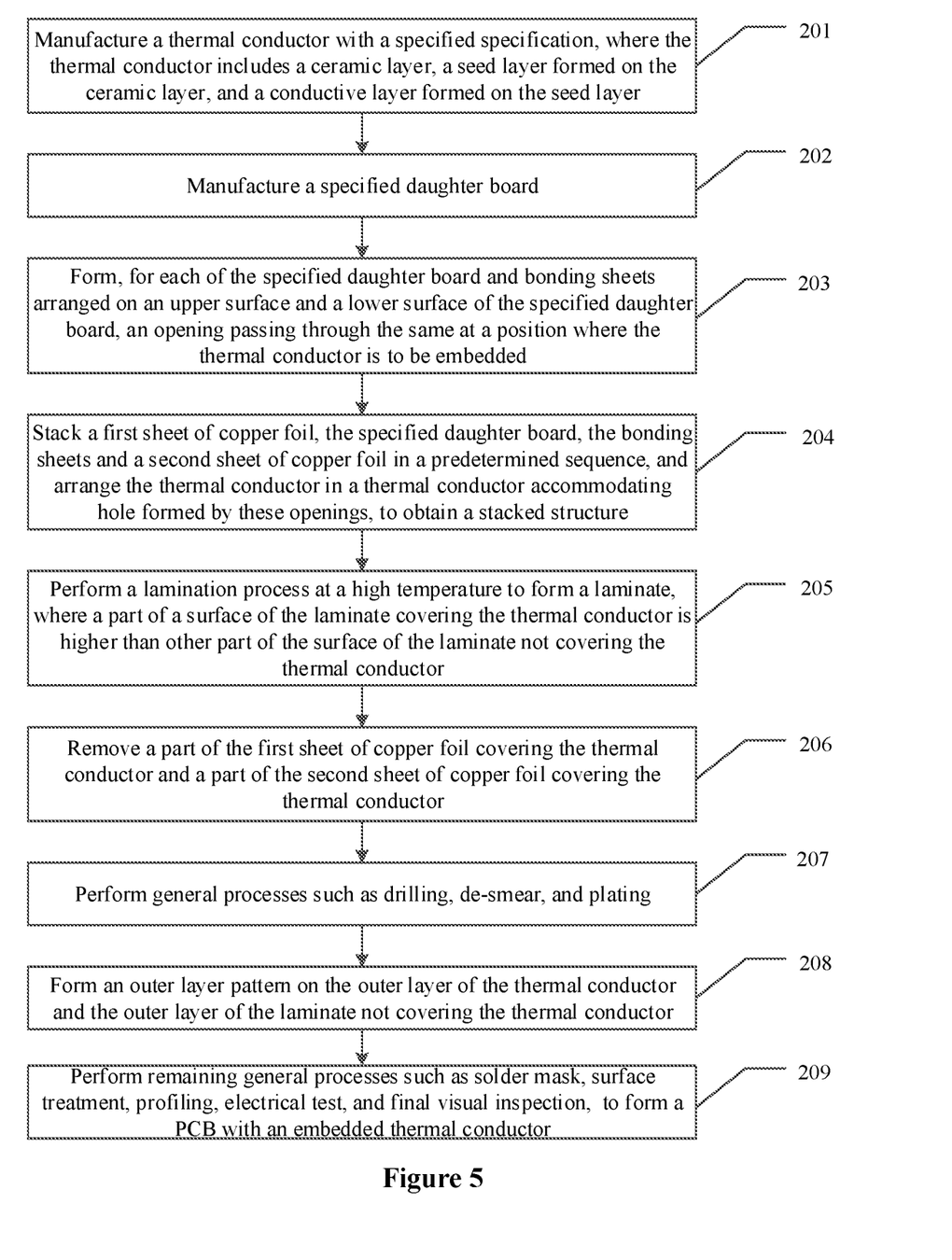
FIG. 5 is a flowchart of a manufacturing method for a PCB (including a daughter board) with an embedded thermal conductor according to an embodiment of the present disclosure.

Reference is made to FIG. 5, which is a flowchart of a method for manufacturing a PCB with an embedded thermal conductor according to an embodiment of the present disclosure. The method includes the following steps 201 to 209.

In step 201, a thermal conductor 5 with a specified size is manufactured. The thermal conductor 5 includes a ceramic layer formed on two surfaces, a seed layer formed on the ceramic layer, and a conductive layer formed on the seed layer.

The thermal conductor 5 is used for heat dissipation, and is manufactured by the same process as described in the above embodiment, which is not repeated here.

In step 202, a specified daughter board is manufactured.

In this step, the specified daughter is manufactured by performing the following steps of:

- stacking a sheet of copper foil, a bonding sheet, a core, . . . , a bonding sheet and a sheet of copper foil sequentially to obtain a stacked structure, and performing a lamination process on the stacked structure to form a first daughter board;
- forming a buried hole, a blind hole in the first daughter board, and forming an outer layer pattern on the first daughter board;
- roughening a board surface of the first daughter board;
- stacking a sheet of copper foil, a bonding sheet, the first daughter board, a bonding sheet and a sheet of copper foil sequentially to obtain a stacked structure, and performing the lamination process the stacked structure to form a second daughter board; and
- repeating the above steps until the specified daughter board is formed by the lamination process.

In step 203, for each of the specified daughter board and the bonding sheets 2 arranged on an upper surface and a lower surface of the specified daughter board, an opening passing through the same is formed at a position where the thermal conductor 5 is to be embedded. In a subsequent stacking process, these openings of the specified daughter board and the bonding sheets 2 form a thermal conductor accommodating hole.

In step 204, a first sheet of copper foil 4, the specified daughter board, the bonding sheets 2 and a second sheet of copper foil 4 are stacked in a predetermined sequence, and the thermal conductor 5 is arranged in the thermal conductor accommodating hole formed by theses openings, to obtain a stacked structure.

No opening passes through each of the first sheet of copper foil 4 and the second sheet of copper foil 4. The first sheet of copper foil 4 and the second sheet of copper foil 4 are respectively arranged on an upper outer layer and a lower outer layer of the stacked structure.

In order to obtain the stacked structure, the first sheet of copper foil 4, the daughter board and the bonding sheets 2 are stacked in a predetermined sequence. The first sheet of copper foil 4 is arranged at the bottom. That is, the first sheet of copper foil 4, a bonding sheet 2, the daughter board, and a bonding sheet 2 are sequentially arranged from bottom to top. Next, the thermal conductor 5 is arranged in the thermal conductor accommodating hole. Finally, the second sheet of copper foil 4 is arranged at the top.

In step 205, a lamination process is performed on the stacked structure at a high temperature to form a laminate. A part of a surface of the laminate covering the thermal conductor protrudes from other part.

In step S206, a part of the first sheet of copper foil 4 covering the thermal conductor and a part of the second sheet of copper foil 4 covering the thermal conductor are removed.

In step 207, general processes such as drilling, de-smear, and copper plating are performed.

In step 208, an outer layer pattern is manufactured on the outer layer of the thermal conductor 5 and the outer layer of the laminate.

If the seed layer can be removed by conventional etching, the outer layer pattern is formed simultaneously on the outer layer of the thermal conductor 5 and on the outer layer of the laminate. If the seed layer cannot be removed by conventional etching, the outer layer pattern is formed separately on the outer layer of the thermal conductor 5 and on the outer layer of the laminate, so as to avoid mutual influence.

In step 209, remaining general processes such as solder mask, surface finish, profiling, electrical test, and final quality check are performed, so that a PCB with an embedded thermal conductor is finished.

In summary, the method for manufacturing a PCB including a daughter board is provided according to this embodiment, including an additional step of manufacturing the specified daughter board before forming the opening compared with the method for manufacturing a PCB without a daughter board. Other steps in the method for manufacturing a PCB including a daughter board are basically the same as that in the method for manufacturing a PCB without a daughter board. Similarly, in the method for manufacturing a PCB including a daughter board, no opening passes through the sheet of copper foil 4 on an outer layer before the lamination process, so that the surface of the sheet of copper foil 4 has good flatness during the lamination process, thereby avoiding wrinkles. Moreover, the sheet of copper-clad ceramic serves as the thermal conductor 5, so that a pattern is manufactured on the outer layer of the thermal conductor 5 based on the exposed conductive layer, improving the overall density of circuit traces of the PCB.

Third Embodiment

A PCB is provided according to this embodiment. The PCB is manufactured with the method described in the above embodiments. The embedded thermal conductor 5 includes the ceramic layer and the conductive layer formed on the seed layer, so that the pattern is manufactured on the outer layer of the thermal conductor 5, thereby improving the density of circuit traces of the PCB.

The embodiments described above are only provided for describing the technical solutions of the present disclosure rather than limiting the technical solutions. Although the present disclosure is described in detail with reference to the embodiments described above, those skilled in the art should understand that modifications may be made to the technical solutions described in the above embodiments or equivalent substitutions may be made to a part or all of the technical features. These modifications or substitutions do not enable the essence of the corresponding technical solutions to depart from the spirit and the scope of the technical solutions according to the embodiments of the present disclosure.

The invention claimed is:

1. A method for manufacturing a printed circuit board (PCB) with an embedded thermal conductor, comprising:

stacking a core with an opening or a specified daughter board with an opening with at least one bonding sheet with an opening in a predetermined sequence to form a stack, the openings of the core or specified daughter board and the at least one bonding sheet forming a thermal conductor accommodation hole;

arranging a thermal conductor including a conductive layer in the thermal conductor accommodation hole of the stack such that the thermal conductor is flush with the stack;

stacking a first sheet of copper foil and a second sheet of copper foil on either side of the stack with the thermal conductor in the accommodation hole to form a stacked structure, wherein each of the first sheet of copper foil and the second sheet of copper foil has no opening;

performing a lamination process on the stacked structure at a high temperature to form a laminate, wherein a part of a surface of the laminate covering the thermal conductor protrudes from an other part of the surface of the laminate not covering the thermal conductor;

removing a part of the first sheet of copper foil covering the thermal conductor and a part of the second sheet of copper foil covering the thermal conductor from the laminate, to expose the conductive layer of the thermal conductor; and manufacturing an outer layer pattern on an outer layer of the thermal conductor and/or an outer layer of the laminate not covering the thermal conductor of the laminate.

2. The method for manufacturing a PCB with an embedded thermal conductor according to claim 1, wherein the thermal conductor comprises a ceramic layer and the conductive layer, and the conductive layer is formed on a seed layer and the seed layer is arranged on each of two outer surfaces of the ceramic layer.

3. The method for manufacturing a PCB with an embedded thermal conductor according to claim 2, further comprising:

manufacturing the thermal conductor, wherein the manufacturing the thermal conductor comprises:

plating copper on the seed layer arranged on each of an upper outer surface and a lower outer surface of a large sheet of ceramic having a specified thickness, to form a large sheet of copper-clad ceramic, and dividing the large sheet of copper-clad ceramic into a plurality of small sheets of copper-clad ceramic each having a specified size, to obtain the thermal conductor.

4. The method for manufacturing a PCB with an embedded thermal conductor according to claim 3, wherein the manufacturing the thermal conductor further comprises:

roughening a surface and/or a side face of each of the small sheets of copper-clad ceramic.

5. The method for manufacturing a PCB with an embedded thermal conductor according to claim 1, wherein the manufacturing an outer layer pattern comprises:

manufacturing, by pattern transfer, the outer layer pattern simultaneously on the outer layer of the thermal conductor and the outer layer of the laminate not covering the thermal conductor.

6. The method for manufacturing a PCB with an embedded thermal conductor according to claim 1, wherein the manufacturing an outer layer pattern comprises:

manufacturing the outer layer pattern on one of the outer layer of the thermal conductor and the outer layer of the laminate not covering the thermal conductor, wherein the other of the outer layer of the thermal conductor and the outer layer of the laminate not covering the thermal conductor is protected.

7. The method for manufacturing a PCB with an embedded thermal conductor according to claim 1, wherein the part of the sheet of copper foil is removed by processes of dry film, exposure, developing and etching.

8. The method for manufacturing a PCB with an embedded thermal conductor according to claim 1, wherein the thermal conductor accommodating hole is greater in size than the thermal conductor in cross section.

* * * * *